(12) United States Patent
Pakula et al.

(10) Patent No.: US 9,992,891 B2
(45) Date of Patent: Jun. 5, 2018

(54) INSERT MOLDING AROUND GLASS MEMBERS FOR PORTABLE ELECTRONIC DEVICES

(71) Applicant: Apple Inc., Cupertino, CA (US)

(72) Inventors: David Pakula, San Francisco, CA (US); Stephen Brian Lynch, Portola Valley, CA (US); Richard Hung Minh Dinh, Cupertino, CA (US); Tang Yew Tan, San Francisco, CA (US); Lee Hua Tan, Singapore (SG)

(73) Assignee: APPLE INC., Cupertino, CA (US)

(*) Notice: Subject to any disclaimer, the term of this patent is extended or adjusted under 35 U.S.C. 154(b) by 2 days.

(21) Appl. No.: 14/993,058

(22) Filed: Jan. 11, 2016

(65) Prior Publication Data

US 2016/0212872 A1 Jul. 21, 2016

Related U.S. Application Data

(63) Continuation of application No. 12/944,671, filed on Nov. 11, 2010, now Pat. No. 9,235,240.

(51) Int. Cl.
*H05K 5/02* (2006.01)
*H04M 1/03* (2006.01)
(Continued)

(52) U.S. Cl.
CPC ............ *H05K 5/03* (2013.01); *A45C 11/00* (2013.01); *A45F 5/00* (2013.01); *G06F 1/1626* (2013.01);
(Continued)

(58) Field of Classification Search
CPC ..................... H05K 5/0017; H01M 1/0249
See application file for complete search history.

(56) References Cited

U.S. PATENT DOCUMENTS

| D118,749 S | 1/1940 | Zimmerman |
| D124,596 S | 1/1941 | Arenberg |

(Continued)

FOREIGN PATENT DOCUMENTS

| CN | 101379459 A | 3/2009 |
| CN | 101722635 A | 6/2010 |

(Continued)

OTHER PUBLICATIONS

International Search Report and Written Opinion for International Application No. PCT/US2011/058999, dated Feb. 15, 2012.
(Continued)

*Primary Examiner* — Hung V Ngo
(74) *Attorney, Agent, or Firm* — Brownstein Hyatt Farber Schreck, LLP

(57) ABSTRACT

An electronic device having an enclosure formed from at least one glass cover and a peripheral structure formed adjacent the periphery of the glass cover is disclosed. The peripheral structure can be secured adjacent to the glass cover with an adhesive. The peripheral structure can be molded adjacent the glass cover so that a gapless interface is formed between the peripheral structure and the periphery of the glass cover. In one embodiment, the peripheral structure includes at least an inner peripheral structure and an outer peripheral structure.

24 Claims, 7 Drawing Sheets

(51) Int. Cl.

| | | |
|---|---|---|
| *H05K 5/03* | (2006.01) | |
| *H04M 1/02* | (2006.01) | |
| *G06F 1/16* | (2006.01) | |
| *A45C 11/00* | (2006.01) | |
| *A45F 5/00* | (2006.01) | |
| *G06F 3/041* | (2006.01) | |
| *H05K 5/00* | (2006.01) | |

(52) U.S. Cl.
CPC ............ *G06F 1/1656* (2013.01); *G06F 3/041* (2013.01); *H04M 1/0249* (2013.01); *H04M 1/0266* (2013.01); *H05K 5/0017* (2013.01)

(56) References Cited

U.S. PATENT DOCUMENTS

| | | |
|---|---|---|
| 2,269,554 A | 1/1942 | Rolph |
| 4,403,224 A | 9/1983 | Wirnowski |
| 4,522,508 A | 6/1985 | Meister |
| 4,995,941 A | 2/1991 | Nelson et al. |
| 5,394,306 A | 2/1995 | Koenck et al. |
| 5,456,955 A | 10/1995 | Muggli |
| 5,514,319 A | 5/1996 | Young |
| 5,613,237 A | 3/1997 | Bent et al. |
| 5,681,515 A | 10/1997 | Pratt et al. |
| 5,867,149 A | 2/1999 | Jaeger |
| 5,932,329 A | 8/1999 | Frost et al. |
| 6,058,293 A | 5/2000 | Phillips |
| 6,206,563 B1 | 3/2001 | Dombre et al. |
| 6,229,993 B1 | 5/2001 | Greenway et al. |
| 6,266,685 B1 | 7/2001 | Danielson et al. |
| 6,323,846 B1 | 11/2001 | Westerman et al. |
| 6,462,890 B2 | 10/2002 | Hsu |
| 6,510,226 B1 | 1/2003 | Thomann et al. |
| 6,532,152 B1 | 3/2003 | White et al. |
| 6,560,092 B2 | 5/2003 | Itou et al. |
| 6,777,621 B2 | 8/2004 | Ishikawa et al. |
| 6,796,708 B2 | 9/2004 | Kawamata et al. |
| 6,825,751 B1 | 11/2004 | Kita et al. |
| 6,842,288 B1 | 1/2005 | Liu et al. |
| 6,876,543 B2 | 4/2005 | Mockridge et al. |
| 6,965,789 B2 | 11/2005 | Hauge et al. |
| 6,980,095 B2 | 12/2005 | Wright et al. |
| 7,031,148 B1 | 4/2006 | Lin |
| 7,046,230 B2 | 5/2006 | Zadesky et al. |
| 7,073,916 B2 | 7/2006 | Yin et al. |
| 7,113,237 B2 | 9/2006 | Nitto et al. |
| 7,236,588 B2 | 6/2007 | Gartrell |
| 7,595,983 B2 | 9/2009 | Okuda |
| D606,539 S | 12/2009 | Liao et al. |
| 7,636,244 B2 | 12/2009 | Kriege et al. |
| 7,697,269 B2 | 4/2010 | Yang et al. |
| 7,697,281 B2 | 4/2010 | Dabov et al. |
| 7,711,256 B2 | 5/2010 | Wun |
| 7,872,861 B2 | 1/2011 | Ou et al. |
| 7,933,123 B2 | 4/2011 | Wang et al. |
| 8,004,835 B2 | 8/2011 | Conti et al. |
| 8,023,261 B2 | 9/2011 | Sanford |
| 8,238,087 B2 | 8/2012 | McClure et al. |
| 8,254,098 B2 | 8/2012 | Liu et al. |
| 8,320,978 B2 | 11/2012 | Chang et al. |
| 8,797,721 B2 | 8/2014 | Pakula et al. |
| 9,185,816 B2 | 11/2015 | Pakula et al. |
| 9,235,240 B2 | 1/2016 | Pakula et al. |
| 2002/0172017 A1 | 11/2002 | Tarnowski |
| 2003/0006128 A1 | 1/2003 | Giles et al. |
| 2003/0045246 A1 | 3/2003 | Lee et al. |
| 2003/0108720 A1 | 6/2003 | Kashino |
| 2003/0164905 A1 | 9/2003 | Yamaoka et al. |
| 2003/0184894 A1 | 10/2003 | Bischof et al. |
| 2004/0022017 A1 | 2/2004 | Chuang |
| 2004/0042168 A1 | 3/2004 | Yang et al. |
| 2004/0079457 A1 | 4/2004 | Kimura et al. |
| 2005/0030707 A1 | 2/2005 | Richardson |
| 2005/0052425 A1 | 3/2005 | Zadesky et al. |
| 2005/0062902 A1 | 3/2005 | Fukayama |
| 2005/0083308 A1 | 4/2005 | Homer et al. |
| 2005/0130721 A1 | 6/2005 | Gartrell |
| 2005/0285991 A1 | 12/2005 | Yamazaki |
| 2005/0286214 A1 | 12/2005 | Chen |
| 2006/0055839 A1 | 3/2006 | Hirao et al. |
| 2006/0132644 A1 | 6/2006 | Shangguan et al. |
| 2006/0158839 A1 | 7/2006 | Deluga |
| 2006/0197750 A1 | 9/2006 | Kerr et al. |
| 2006/0239746 A1 | 10/2006 | Grant |
| 2006/0268528 A1 | 11/2006 | Zadesky et al. |
| 2007/0025072 A1 | 2/2007 | Liao |
| 2007/0052679 A1 | 3/2007 | Liang |
| 2007/0173299 A1 | 7/2007 | Sawayama et al. |
| 2007/0257398 A1 | 11/2007 | Moncieff |
| 2008/0062660 A1 | 3/2008 | Weber et al. |
| 2008/0092809 A1 | 4/2008 | Lin et al. |
| 2008/0131683 A1 | 6/2008 | Ristic-Lehmann et al. |
| 2008/0146293 A1 | 6/2008 | Kim et al. |
| 2008/0166009 A1 | 7/2008 | Dinh et al. |
| 2008/0206492 A1 | 8/2008 | Husemann et al. |
| 2008/0239647 A1 | 10/2008 | Luo et al. |
| 2008/0264548 A1 | 10/2008 | Zhang |
| 2008/0266766 A1 | 10/2008 | D'Urso et al. |
| 2008/0316117 A1 | 12/2008 | Hill et al. |
| 2009/0002930 A1 | 1/2009 | Nakanishi et al. |
| 2009/0046072 A1 | 2/2009 | Emig et al. |
| 2009/0046240 A1 | 2/2009 | Bolton |
| 2009/0054115 A1 | 2/2009 | Horrdin et al. |
| 2009/0059485 A1 | 3/2009 | Lynch et al. |
| 2009/0059502 A1 | 3/2009 | Filson et al. |
| 2009/0065136 A1 | 3/2009 | Nadella et al. |
| 2009/0067141 A1 | 3/2009 | Dabov et al. |
| 2009/0093575 A1 | 4/2009 | Kabashima et al. |
| 2009/0245564 A1 | 10/2009 | Mittleman et al. |
| 2009/0257189 A1 | 10/2009 | Wang et al. |
| 2009/0257207 A1 | 10/2009 | Wang et al. |
| 2009/0264160 A1 | 10/2009 | Mochizuki et al. |
| 2009/0296325 A1 | 12/2009 | Morimoto et al. |
| 2010/0014232 A1 | 1/2010 | Nishimura |
| 2010/0060563 A1 | 3/2010 | Hayton et al. |
| 2010/0061040 A1 | 3/2010 | Dabov et al. |
| 2010/0061044 A1 | 3/2010 | Zou et al. |
| 2010/0089729 A1 | 4/2010 | Li et al. |
| 2010/0091442 A1 | 4/2010 | Theoblad et al. |
| 2010/0120480 A1 | 5/2010 | Jung |
| 2010/0149410 A1 | 6/2010 | Matsuzawa |
| 2010/0190530 A1 | 7/2010 | Wade et al. |
| 2010/0203924 A1 | 8/2010 | Hirota |
| 2010/0269891 A1 | 10/2010 | Kinard et al. |
| 2010/0283394 A1 | 11/2010 | Ong |
| 2010/0315570 A1 | 12/2010 | Mathew et al. |
| 2011/0050053 A1 | 3/2011 | Deng |
| 2011/0050054 A1 | 3/2011 | Chang et al. |
| 2011/0086676 A1 | 4/2011 | Choi et al. |
| 2011/0096483 A1 | 4/2011 | Sapper et al. |
| 2011/0136553 A1 | 6/2011 | Jo |
| 2011/0164365 A1 | 7/2011 | McClure et al. |
| 2011/0165361 A1 | 7/2011 | Sherman et al. |
| 2011/0186345 A1 | 8/2011 | Pakula et al. |
| 2011/0187245 A1 | 8/2011 | Pakula et al. |
| 2011/0188180 A1 | 8/2011 | Pakula et al. |
| 2011/0215685 A1 | 9/2011 | Jarvis et al. |
| 2011/0255218 A1 | 10/2011 | Pakula et al. |
| 2011/0255227 A1 | 10/2011 | Murakami |
| 2012/0113611 A1 | 5/2012 | Maniar et al. |
| 2012/0118628 A1 | 5/2012 | Pakula et al. |
| 2012/0275088 A1 | 11/2012 | Huang |
| 2012/0281381 A1* | 11/2012 | Sanford ............... G06F 1/1626 361/807 |
| 2013/0082883 A1* | 4/2013 | Montevirgen ......... H01Q 1/243 343/702 |
| 2016/0054537 A1 | 2/2016 | Pakula et al. |
| 2016/0062398 A1 | 3/2016 | Pakula et al. |

FOREIGN PATENT DOCUMENTS

| | | |
|---|---|---|
| CN | 101518168 A | 12/2011 |
| CN | 101458408 A | 1/2012 |

(56) References Cited

FOREIGN PATENT DOCUMENTS

| EP | 0458016 A1 | | 11/1991 |
|---|---|---|---|
| EP | 2066162 | * | 6/2009 |
| EP | 2154596 | | 2/2010 |
| JP | 6-94848 | | 4/2004 |
| JP | A 2006-276623 | | 10/2006 |
| JP | A 2008-518807 | | 6/2008 |
| JP | A 2009/259908 | | 11/2009 |
| JP | A 2010-091742 | | 4/2010 |
| WO | WO 2008/035736 | | 3/2008 |
| WO | 2009/024842 A1 | | 2/2009 |
| WO | 2009/126480 A2 | | 10/2009 |
| WO | 2010/033571 | | 3/2010 |
| WO | WO 2010/074144 | | 7/2010 |
| WO | 2010/101961 A2 | | 9/2010 |

OTHER PUBLICATIONS

International Preliminary Report for International Patent Application No. PCT/US2011/058999, dated May 23, 2013.
Lu, "Liquid Optically Clear Adhesives for display Applications", Henkeina.com, Apr. 1, 2001, pp. 1-4.
Henkel, "Loctite Liquid Optically Clear Adhesives", Henkeina.com, downloaded Mar. 18, 2013, pp. 1-2.
Office Action for Taiwanese Patent Application No. 100141093, dated Aug. 30, 2013.
Office Action for Taiwanese Patent Application No. 100141093, dated Mar. 25, 2014.
Notice of Preliminary Rejection for Korean Patent Application No. 10-2013-7014922, dated Jun. 27, 2014.
Office Action for Japanese Patent Application No. 2013-538787, dated Jun. 20, 2014.
Office Action for Australian Patent Application No. 2011326249, dated Nov. 5, 2014.
Notice of Final Rejection for Korean Patent Application No. 10-2013-7014922, dated Jan. 7, 2015.
Final Office Action for Taiwanese Patent Application No. 100141093, dated Jan. 8, 2015.
Japanese Office Action for Japanese Patent Application No. 2013-538787, dated Apr. 17, 2015.
Office Action for Chinese Patent Application No. 201180061259.1, dated Dec. 30, 2015.
Final Office Action for Japanese Patent Application No. 2013-538787, dated Feb. 19, 2016.
Restriction Requirement for U.S. Appl. No. 12/944,671, dated Jan. 29, 2013.
Restriction Requirement for U.S. Appl. No. 12/944,671, dated Apr. 26, 2013.
Office Action for U.S. Appl. No. 12/944,671, dated Aug. 30, 2013.
Final Office Action for U.S. Appl. No. 12/944,671, dated Apr. 8, 2014.
Advisory Action for U.S. Appl. No. 12/944,671, dated Jun. 27, 2014.
Office Action for U.S. Appl. No. 12/944,671, dated Aug. 14, 2014.
Final Office Action for U.S. Appl. No. 12/944,671, dated Jan. 15, 2015.
Advisory Action for U.S. Appl. No. 12/944,671, dated Apr. 24, 2015.
Office Action for U.S. Appl. No. 12/944,671, dated Jun. 3, 2015.
Notice of Allowance for U.S. Appl. No. 12/944,671, dated Sep. 21, 2015.
Unknown Author, "Product Data IXEF 1022/0006," XP002435302, http://www.solvaymedical.com/pdf/IXEF1022%200006.pdf, May 2005.

* cited by examiner

INSERT MOLDING AROUND GLASS MEMBERS FOR PORTABLE ELECTRONIC DEVICES

CROSS-REFERENCE TO RELATED APPLICATIONS

This application is a continuations of U.S. application Ser. No. 12/944,671, filed Nov. 11, 2010 and entitled "INSERT MOLDING AROUND GLASS MEMBERS FOR PORTABLE ELECTRONIC DEVICES," which is hereby incorporated herein by reference.

BACKGROUND

Conventionally, a portable electronic device has a housing that encases the various electrical components of the portable electronic device. Often, the portable electronic device has a display arrangement that includes various layers. The various layers usually include at least a display technology layer, and may additionally include a sensing arrangement (e.g., touch sensors or touch screen) and/or a cover window disposed over the display technology layer. The cover window can be a plastic or glass cover that provides a protective outer surface that protects the display technology layer. The cover window can form part of an outer surface for the housing of the portable electronic device. Conventionally, supporting or securing the cover window to other portions of the housing tends to impede usage of a peripheral area of the cover window.

Unfortunately, however, as portable electronic device continue to be made smaller, thinner and/or more powerful, there remains a continuing need to provide improved techniques and structures for supporting cover windows of portable electronic device housings.

SUMMARY

The invention pertains to an electronic device having an enclosure formed from at least one glass cover and a peripheral structure formed adjacent the periphery of the glass cover. The peripheral structure can be secured adjacent to the glass cover with an adhesive. The peripheral structure can be molded adjacent the glass cover so that a gapless interface is formed between the peripheral structure and the periphery of the glass cover. In one embodiment, the peripheral structure can include at least an inner peripheral structure and an outer peripheral structure. The enclosure for the electronic device is can be thin yet be sufficiently strong to be suitable for use in electronic devices, such as portable electronic devices.

The invention can be implemented in numerous ways, including as a method, system, device, or apparatus. Several embodiments of the invention are discussed below.

As an electronic device enclosure, one embodiment can, for example, include at least a glass cover for a top surface for the electronic device enclosure, an adhesive deposited around a periphery of the glass cover, and a peripheral structure for providing a support surface for the glass cover and for providing side protective surfaces for the glass cover. The peripheral structure is at least partially secured to the glass cover by the adhesive.

As a method for assembling an electronic device, one embodiment of the method can, for example, include at least: obtaining a glass member having a top surface and a bottom surface, the top surface providing an outer surface for substantially all of a surface of the electronic device; depositing an adhesive layer around a periphery of the bottom surface of the glass member; aligning the glass member relative to a support structure for the electronic device; and molding a peripheral protective side portion for the electronic device, the peripheral protective side portion being molded adjacent the periphery of the glass member, adjacent the adhesive layer, and adjacent the support structure.

As a method for assembling an electronic device, one embodiment of the method can, for example, include at least: obtaining a glass member having a top surface and a bottom surface, the top surface providing an outer surface for substantially all of a surface of the electronic device; attaching an internal periphery member to a periphery of the bottom surface of the glass member; and molding an outer periphery member adjacent a periphery of the glass member and adjacent the internal periphery member.

As a method for assembling an electronic device, one embodiment of the method can, for example, include at least: obtaining a glass member having a top surface and a bottom surface, the top surface providing an outer surface for substantially all of a surface of the electronic device; providing an adhesive layer around a periphery of the bottom surface of the glass member; and molding a peripheral protective side portion for the electronic device. The peripheral protective side portion being molded adjacent the periphery of the glass member and being secured to the glass member via the adhesive layer.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF EMBODIMENTS OF THE INVENTION

Figure 1:
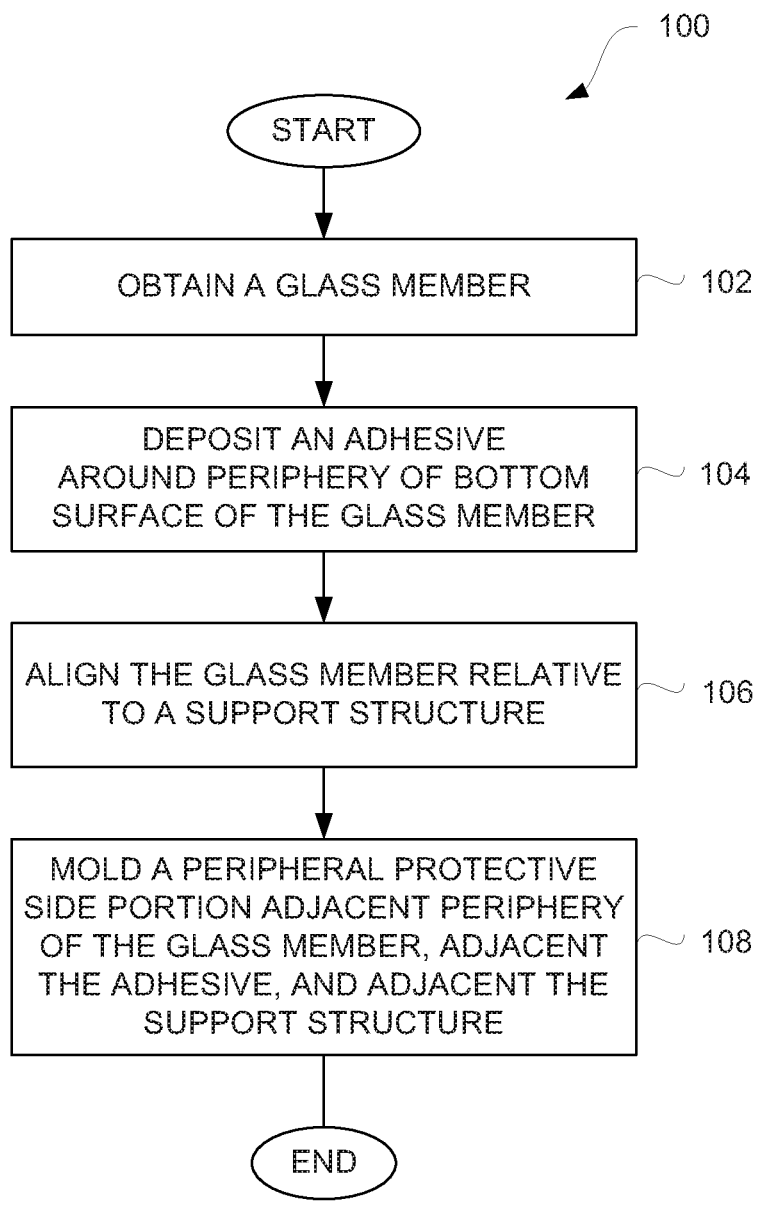
FIG. 1 is a flow diagram of a housing formation process according to one embodiment of the invention.

Embodiments are described herein in the context of a housing for an electronic device. The housing can make use of an outer member, which can be formed of glass. The outer member can be aligned, protected and/or secured with respect to other portions of the housing for the electronic device. The electronic device can be portable and in some cases handheld.

According to one aspect, the invention pertains to an electronic device having an enclosure formed from at least one glass cover and a peripheral structure formed adjacent the periphery of the glass cover. The peripheral structure can be secured adjacent to the glass cover with an adhesive. The peripheral structure can be molded adjacent the glass cover so that a gapless interface is formed between the peripheral structure and the periphery of the glass cover. In one embodiment, the peripheral structure includes at least an inner peripheral structure and an outer peripheral structure.

The following detailed description is illustrative only, and is not intended to be in any way limiting. Other embodiments will readily suggest themselves to skilled persons having the benefit of this disclosure. Reference will now be made in detail to implementations as illustrated in the accompanying drawings. The same reference indicators will generally be used throughout the drawings and the following detailed description to refer to the same or like parts. It should be appreciated that the drawings are generally not drawn to scale, and at least some features of the drawings have been exaggerated for ease of illustration.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments of the invention can relate to apparatus, systems and methods for forming a housing having a thin glass member for an electronic device. In one example, the glass member may be an outer surface of an electronic device. The glass member may for example correspond to a glass cover that helps form part of a display area of an electronic device (i.e., situated in front of a display either as a separate part or integrated within the display. Alternatively or additionally, the glass member may form a part of the housing. For example, it may form an outer surface other than in the display area.

The apparatus, systems and methods for improving strength of thin glass are especially suitable for glass covers, or displays (e.g., LCD displays), assembled in small form factor electronic devices such as handheld electronic devices (e.g., mobile phones, media players, personal digital assistants, remote controls, etc.). The glass can be thin in these small form factor embodiments, such as less than 3 mm, or more particularly between 0.5 and 2.5 mm, or even more particularly between 0.3 and 1.0 mm. The apparatus, systems and methods can also be used for glass covers or displays for other devices including, but not limited to including, relatively larger form factor electronic devices (e.g., portable computers, tablet computers, displays, monitors, televisions, etc.). The glass can also be thin in these larger form factor embodiments, such as less than 5 mm, or more particularly between 0.5 and 3 mm, or even more particularly between 0.3 and 2.0 mm.

Embodiments are discussed below with reference to FIGS. 1-7C. However, those skilled in the art will readily appreciate that the detailed description given herein with respect to these figures is for explanatory purposes as the invention extends beyond these limited embodiments.

FIG. 1 a flow diagram of a housing formation process 100 according to one embodiment of the invention. The housing formation process 100 can operate to produce a housing for an electronic device, or at least a portion of such a housing.

The housing formation process 100 can initially obtain 102 a glass member. The glass member is to serve as a significant outer surface for the housing. For example, the glass member can correspond to a top surface for the housing. Alternatively or additionally, the glass member can correspond to a bottom surface for the housing. The glass member is typically thin, particularly when used with portable electronic devices. In one embodiment, the glass member has a thickness of less than 5 mm, or more particularly less than 1 mm.

After the glass member has been obtained 102, an adhesive can be deposited 104 around a periphery of a bottom surface of the glass member. The glass member has a top surface that can represent an outer surface for the housing, and a bottom surface that is an inner surface that is not exposed. In one embodiment, the adhesive being deposited 104 can be a thermally activated adhesive. The adhesive can, for example, by provided as film or as a layer. Also, the manner by which the adhesive is deposited can vary. In one implementation, the adhesive can be deposited 104 by forming a ring-like pattern of adhesive that can be placed around the periphery of the bottom surface of the glass member. In another implementation, the adhesive can be screen printed onto the periphery of the bottom surface of the glass member.

Thereafter, the glass member can be aligned 106 relative to a support structure. The support structure can be provided as being a component of the housing for the electronic device. For example, the support can pertain to a side structure for the housing or an interior support member. After the glass member has been aligned 106 with the support structure, a peripheral protective side portion can be molded 108 adjacent to the periphery of the glass member and adjacent to the adhesive. The adhesive can serve to secure the peripheral protective side member to the glass member. The peripheral protective side member being molded 108 can also be formed adjacent the support structure. Typically, the peripheral side portion would also be secured to the support structure by chemical bonding and/or mechanical features (e.g., undercuts or interlocks). In such case, the glass member and the peripheral protective side member are secured to the support structure and thus form at least a portion of the housing for the electronic device. Also, if the adhesive is thermally activated, the molding 108 can also serve to activate the thermally activated adhesive so that a strong bond can be provided to the glass member and the peripheral protective side member.

Figure 2A:
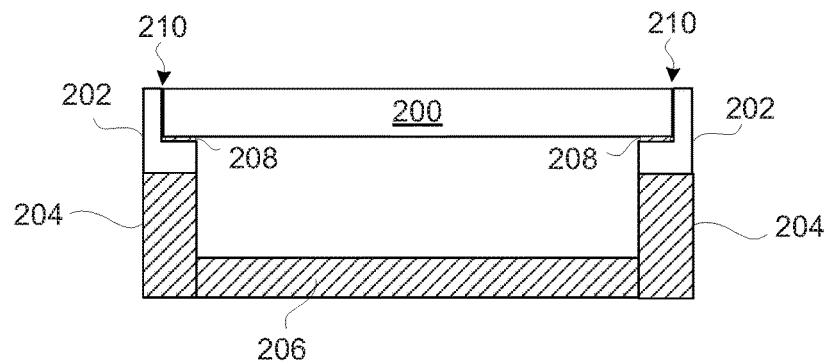
FIG. 2A is a cross-sectional view of an electronic device housing according to one embodiment.

FIG. 2A is a cross-sectional view of an electronic device housing 200 according to one embodiment. The electronic device housing 200 includes an outer housing member 201 supported and protected by a protective side member 202. The protective side member 202 being positioned tightly adjacent sides of the outer housing member 201. The protective side members 202 can provide a thin layer of material positioned tightly adjacent sides of the outer housing member 201, thereby buffering impact at the sides of the outer housing member 201. The protective side member 202 also supports the outer housing member 201 and serves to secure the outer housing member 201 to other portions of the electronic device housing 200. In one embodiment, the protective side member 202 extends around all sides of the outer housing member 201. In another embodiment, the protective side member 202 extends around those of the sides of the outer housing member 201 that would otherwise be exposed.

As shown in FIG. 2A, the outer housing member 201 can be secured to a support structure 204 of the electronic device housing 200. The support structure 204 can, for example, be an outer periphery member for the electronic device housing 200. In one embodiment, the support structure 204 can couple to another outer housing member 206, which can be formed differently than the outer housing member 201.

The protective side member 202 can be secured tightly adjacent the sides of the outer housing member 201 using an adhesive 208. In one embodiment, the adhesive 208 can be applied as a layer of adhesive that is provided around a periphery of an inner side of the outer housing member 201. The protective side member 202 can also be molded in place so as to be tightly adjacent the sides of the outer housing member 201. By molding the protective side member 202 in place, the outer exposed interface 210 between the sides (e.g., edges) of the outer housing member 201 and the peripheral side member 202 is essentially gap-free. The protective side member 202 can also be molded against the adhesive 208 deposited on the periphery of the bottom side of the outer housing member 201. The adhesive 208 can thus serve to secure the protective side member 202 against the sides of the outer housing member 201. Also, if the adhesive 208 is thermally activated, the molding of the protective side member 202 can also serve to activate the thermally activated adhesive 208 so that a strong bond can be provided to the outer housing member 201 and the peripheral protective side member 202 via the adhesive 208. An internal space 212 is provided internal to the electronic device housing 200 whereby various electrical components can be attached, affixed or placed so as to provide electronic operations for the electronic device.

The various members, parts or assemblies of the electronic device housing 200 can be formed of any of a variety of materials, e.g., glass, polymers or metal. In one embodiment, the outer housing member 201 is glass, the protective side member 202 is be formed from polymer (e.g., thermoplastic), the support structure 204 is formed from metal or polymer (e.g., plastic), and the another outer housing member 206 is formed from glass, polymer (e.g., plastic) or metal. More particularly, in some embodiments, the protective side member 202 can be a structurally strengthened polymer (e.g., thermoplastic). As an example, the protective side member 202 can be polymer, such as polyarylamide, nylon or polycarbonate, which can be structurally strengthened by including glass fibers. For example, some examples of some structurally strengthened polymers include 50% glass filled nylon and 30% glass filled polycarbonate.

Figure 2B:
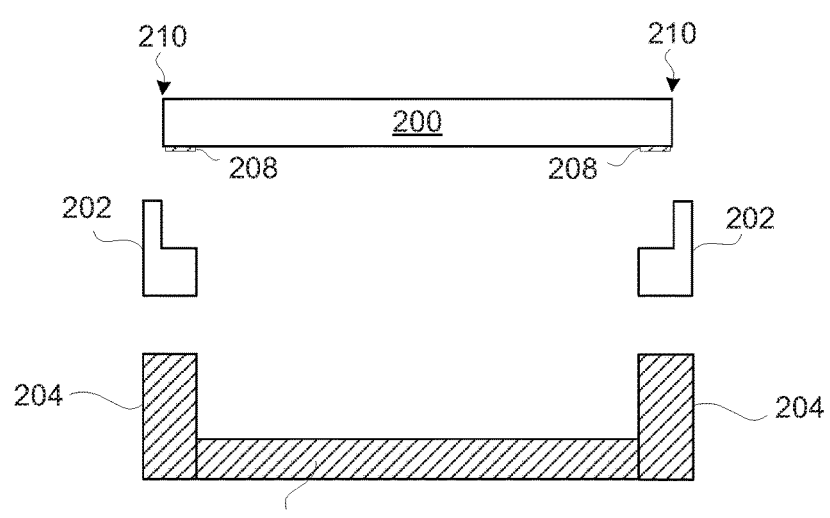
FIG. 2B is a cross-sectional assembly diagram for the electronic device housing shown in FIG. 2A, according to one embodiment.

FIG. 2B is a cross-sectional assembly diagram for the electronic device housing 200 shown in FIG. 2A, according to one embodiment. The outer housing member 201 has a top surface 214 and a bottom surface 216. The bottom surface 216 of the outer housing member 201 has adhesive 208 applied as a layer of adhesive that is provided around a periphery of the bottom surface 216 of the outer housing member 201. The protective side member 202 can then be molded adjacent the sides of the outer housing member 201. When the protective side member 202 is molded, the protective side member 202 is also at least partially formed adjacent the adhesive 208 on the bottom surface 216 of the outer housing member. Moreover, when the protective side member 202 is formed, the protective side member 202 can also be adjacent and secured to an upper side portion 218 of the support structure 204. When the protective side member 202 are provided at the sides (i.e., edges) of the outer housing member 201, the protective side member 202 provides a buffer layer (e.g., bumper) that dampens impact induced at the sides of the outer housing member 201 of the electronic device housing 200.

Figure 2C:
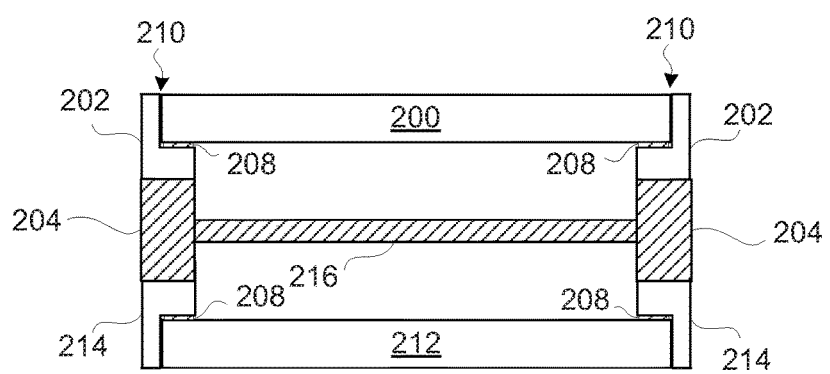
FIG. 2C is a cross-sectional view of an electronic device housing according to one embodiment.

FIG. 2C is a cross-sectional view of an electronic device housing 220 according to one embodiment. The electronic device housing 220 includes a first outer housing member 201 supported and protected by a first protective side member 202. The first protective side member 202 is positioned tightly adjacent sides of the first outer housing member 201. The first protective side member 202 also supports the first outer housing member 201 and serves to secure the first outer housing member 201 to other portions of the electronic device housing 220. In this embodiment, the first protective side member 202 is secured to not only the first outer housing member 201 but also a support structure 204. The support structure 204 may be an outer periphery member for the electronic device housing 220.

The first protective side member 202 can be secured tightly adjacent the sides of the outer housing member 201 using the adhesive 208. In one embodiment, the adhesive 208 can be applied as a layer of adhesive that is provided around a periphery of an inner side of the first outer housing member 201. The first protective side member 202 can also be molded in place so as to be tightly adjacent the sides of the first outer housing member 201. By molding the first protective side member 202 in place, the outer exposed interface 210 between the sides (e.g., edges) of the outer housing member 201 and the peripheral side member 202 is essentially gap-free. The first protective side member 202 can also be molded against the adhesive 208 deposited on the periphery of the bottom side of the first outer housing member 201. The adhesive 208 can thus serve to secure the first protective side member 202 against the sides of the outer housing member 201. Also, if the adhesive 208 is thermally activated, the molding of the first protective side member 202 can also serve to activate the thermally activated adhesive 208 so that a strong bond can be provided to the first outer housing member 201 and the first peripheral protective side member 202 via the adhesive 208.

The electronic device housing 220 can also include an internal structure 222 that is integral with or secured to the support structure 204. In one embodiment, the internal structure 222 can be secured to an inner surface of the support structure 204 such that it is offset from front and back planar boundaries of the support structure 204 (which may be an outer periphery member). As shown in FIG. 2C, the internal structure 222 can be secured at the mid-point of the height of the support structure 204. A first internal space 224 is provided internal to the electronic device housing 220 whereby various electrical components can be attached, affixed or placed so as to provide electronic operations for the electronic device.

In this embodiment, the electronic device housing 220 can also include similar structures on an opposite side of the electronic device housing 220. Namely, the electronic device housing 220 can further include a second outer housing member 226 supported and protected by a second protective side member 228. The second protective side member 228 can be positioned tightly adjacent sides of the second outer housing member 226. The second protective side member 228 also supports the second outer housing member 226 and serves to secure the second outer housing member 226 to other portions of the electronic device housing 220. In this embodiment, the second protective side member 228 is secured to not only the second outer housing member 226 but also the support structure 204. As previously noted, the support structure 204 may be an outer periphery member for the electronic device housing 220. In this embodiment, the second protective side member 228 can be secured to the outer periphery member 204 on the opposite side from the first protective side member 202. The second protective side member 228 can be secured tightly adjacent the sides of the second outer housing member 226 using an adhesive 330. In one embodiment, the adhesive 330 can be applied as a layer of adhesive that is provided around a periphery of an inner side of the second outer housing member 226. The second protective side member 228 can also be molded in place so as to be tightly adjacent the sides of the second outer housing member 226. Further, a second internal space 232 is provided internal to the electronic device housing 220 (between the internal structure 222 and the second outer housing member 226) whereby various electrical components can be attached, affixed or placed so as to provide electronic operations for the electronic device. The second internal space 230 can be separate from or joined with the first internal space 224.

In one embodiment, the first outer housing member 201 can represent a top outer surface for the portable electronic device, and the second outer surface housing 226 can represent a bottom outer surface housing. In one embodiment, both the first outer housing member 201 and the second outer housing member 226 are glass (e.g., glass covers).

Figure 3A:
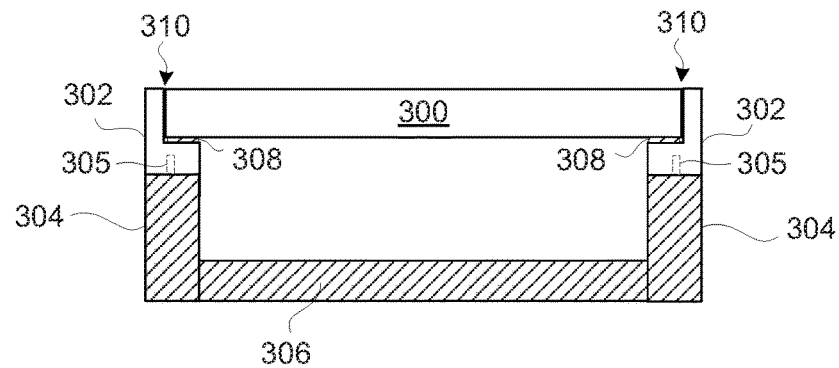
FIG. 3A is a cross-sectional view of an electronic device housing according to one embodiment.

FIG. 3A is a cross-sectional view of an electronic device housing 300 according to one embodiment. The electronic device housing 300 includes an outer housing member 301 supported and protected by a protective side member 302. The protective side member 302 being positioned tightly adjacent sides of the outer housing member 301. The protective side members 302 can provide a thin layer of material positioned tightly adjacent sides of the outer housing member 301, thereby buffering impact at the sides of the outer housing member 301. The protective side member 302 also supports the outer housing member 301 and serves to secure the outer housing member 301 to other portions of the electronic device housing 300. In one embodiment, the protective side member 302 extends around all sides of the outer housing member 301. In another embodiment, the protective side member 302 extends around those of the sides of the outer housing member 301 that would otherwise be exposed.

As shown in FIG. 3A, the outer housing member 301 can be secured to a support structure 304 of the electronic device housing 300. In one embodiment, as shown in FIG. 3A, one or more securing features 305 can be provided on an upper surface of the housing structure 304. The securing features 305 can be integral with the housing structure 304. The securing features 305 (e.g., mechanical features, such as undercuts or interlocks) can be used to assist with the securing of the protective side member 302 (and thus the outer housing member 301) to the housing structure 304. The support structure 304 can, for example, be an outer periphery member for the electronic device housing 300. The support structure 304 can couple to another outer housing member 306, which can be formed differently than the outer housing member 301.

The protective side member 302 can be secured tightly adjacent the sides of the outer housing member 301 using an adhesive 308. In one embodiment, the adhesive 308 can be applied as a layer of adhesive that is provided around a periphery of an inner side of the outer housing member 301. The protective side member 302 can also be molded in place so as to be tightly adjacent the sides of the outer housing member 301. By molding the protective side member 302 in place, the outer exposed interface 310 between the sides (e.g., edges) of the outer housing member 301 and the peripheral side member 302 is essentially gap-free. The protective side member 302 can also be molded against the adhesive 308 deposited on the periphery of the bottom side of the outer housing member 301. The adhesive 308 can thus serve to secure the protective side member 302 against the sides of the outer housing member 301. Also, if the adhesive 308 is thermally activated, the molding of the protective side member 302 can also serve to activate the thermally activated adhesive 308 so that a strong bond can be provided to the outer housing member 301 and the peripheral protective side member 302 via the adhesive 308. An internal space 312 is provided internal to the electronic device housing 300 whereby various electrical components can be attached, affixed or placed so as to provide electronic operations for the electronic device.

The various members, parts or assemblies of the electronic device housing 300 can be formed of any of a variety of materials, e.g., glass, polymers or metal. In one embodiment, the outer housing member 301 is glass, the protective side member 302 is be formed from polymer (e.g., thermoplastic), the support structure 304 is formed from metal or polymer (e.g., plastic), and the another outer housing member 306 is formed from glass, polymer (e.g., plastic) or metal. More particularly, in some embodiments, the protective side member 302 can be a structurally strengthened polymer (e.g., thermoplastic). As an example, the protective side member 302 can be polymer, such as polyarylamide, nylon or polycarbonate, which can be structurally strengthened by including glass fibers. For example, some examples of some structurally strengthened polymers include 50% glass filled nylon and 30% glass filled polycarbonate.

Figure 3B:
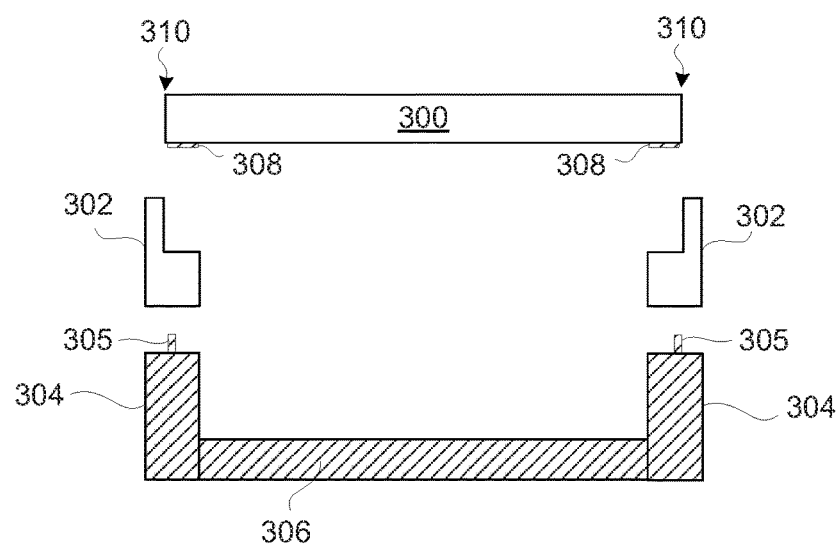
FIG. 3B is a cross-sectional assembly diagram for the electronic device housing shown in FIG. 3A, according to one embodiment.

FIG. 3B is a cross-sectional assembly diagram for the electronic device housing 300 shown in FIG. 3A, according to one embodiment. The outer housing member 301 has a top surface 314 and a bottom surface 316. The bottom surface 316 of the outer housing member 301 has adhesive 308 applied as a layer of adhesive that is provided around a periphery of the bottom surface 316 of the outer housing member 301. The protective side member 302 can then be molded adjacent the sides of the outer housing member 301. When the protective side member 302 is molded, the protective side member 302 is also at least partially formed adjacent the adhesive 308 on the bottom surface 316 of the outer housing member. Moreover, when the protective side member 302 is formed, the protective side member 302 can also be adjacent and secured to an upper side portion 318 of the support structure 304. In one embodiment, as shown in FIG. 3B, one or more securing features 305 can be provided on an upper surface of the housing structure 304. The protective side member 302 can be also molded around the one or more securing features 305, which can further secure the protective side member 302 to the support structure 304. When the protective side member 302 are provided at the sides (i.e., edges) of the outer housing member 301, the protective side member 302 provides a buffer layer (e.g., bumper) that dampens impact induced at the sides of the outer housing member 301 of the electronic device housing 300.

Figure 3C:
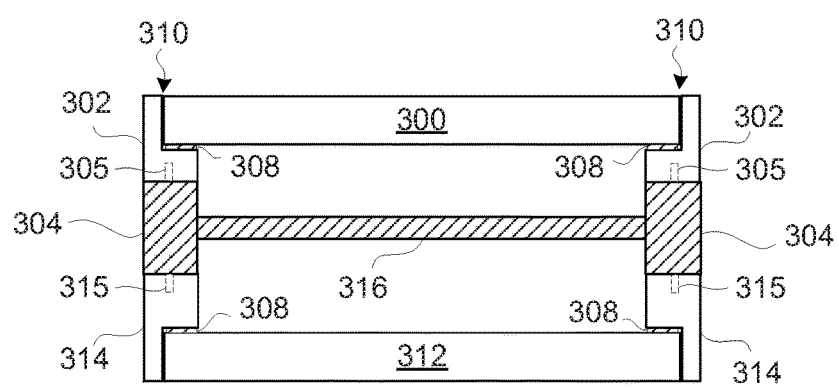
FIG. 3C is a cross-sectional view of an electronic device housing according to one embodiment.

FIG. 3C is a cross-sectional view of an electronic device housing 320 according to one embodiment. The electronic device housing 320 includes a first outer housing member 301 supported and protected by a first protective side member 302. The first protective side member 302 is positioned tightly adjacent sides of the first outer housing member 301. The first protective side member 302 also supports the first outer housing member 301 and serves to secure the first outer housing member 301 to other portions of the electronic device housing 320. In this embodiment, the first protective side member 302 is secured to not only the first outer housing member 301 but also a support structure 304. In addition, in this embodiment, one or more securing features 305 can be provided on an upper surface of the housing structure 304. The support structure 304 may be an outer periphery member for the electronic device housing 320.

The first protective side member 302 can be secured tightly adjacent the sides of the outer housing member 301 using the adhesive 308. In one embodiment, the adhesive 308 can be applied as a layer of adhesive that is provided around a periphery of an inner side of the first outer housing member 301. The first protective side member 302 can also be molded in place so as to be tightly adjacent the sides of the first outer housing member 301. By molding the first protective side member 302 in place, the outer exposed interface 310 between the sides (e.g., edges) of the outer housing member 301 and the peripheral side member 302 is essentially gap-free. The first protective side member 302 can also be molded against the adhesive 308 deposited on the periphery of the bottom side of the first outer housing member 301. The adhesive 308 can thus serve to secure the first protective side member 302 against the sides of the outer housing member 301. Also, if the adhesive 308 is thermally activated, the molding of the first protective side member 302 can also serve to activate the thermally activated adhesive 308 so that a strong bond can be provided to the first outer housing member 301 and the first peripheral protective side member 302 via the adhesive 308.

The electronic device housing 320 can also include an internal structure 322 that is integral with or secured to the support structure 304. In one embodiment, the internal structure 322 can be secured to an inner surface of the support structure 304 such that it is offset from front and back planar boundaries of the support structure 304 (which may be an outer periphery member). As shown in FIG. 3C, the internal structure 322 can be secured at the mid-point of the height of the support structure 304. A first internal space 324 is provided internal to the electronic device housing 320 whereby various electrical components can be attached, affixed or placed so as to provide electronic operations for the electronic device.

In this embodiment, the electronic device housing 320 can also include similar structures on an opposite side of the electronic device housing 320. Namely, the electronic device housing 320 can further include a second outer housing member 326 supported and protected by a second protective side member 328. The second protective side member 328 can be positioned tightly adjacent sides of the second outer housing member 326. The second protective side member 328 also supports the second outer housing member 326 and serves to secure the second outer housing member 326 to other portions of the electronic device housing 320. In this embodiment, the second protective side member 328 is secured to not only the second outer housing member 326 but also the support structure 304. In addition, in this embodiment, one or more securing features 329 can be provided on a bottom surface of the housing structure 304. The securing features 329 can be integral with the housing structure 304. As previously noted, the support structure 304 may be an outer periphery member for the electronic device housing 320. In this embodiment, the second protective side member 328 can be secured to the outer periphery member 304 on the opposite side from the first protective side member 302. The second protective side member 328 can be secured tightly adjacent the sides of the second outer housing member 326 using an adhesive 330. In one embodiment, the adhesive 330 can be applied as a layer of adhesive that is provided around a periphery of an inner side of the second outer housing member 326. The second protective side member 328 can also be molded in place so as to be tightly adjacent the sides of the second outer housing member 326. Further, a second internal space 332 is provided internal to the electronic device housing 320 (between the internal structure 322 and the second outer housing member 326) whereby various electrical components can be attached, affixed or placed so as to provide electronic operations for the electronic device. The second internal space 330 can be separate from or joined with the first internal space 324.

In one embodiment, the first outer housing member 301 can represent a top outer surface for the portable electronic device, and the second outer surface housing 326 can represent a bottom outer surface housing. In one embodiment, both the first outer housing member 301 and the second outer housing member 326 are glass (e.g., glass covers).

Figure 4A:
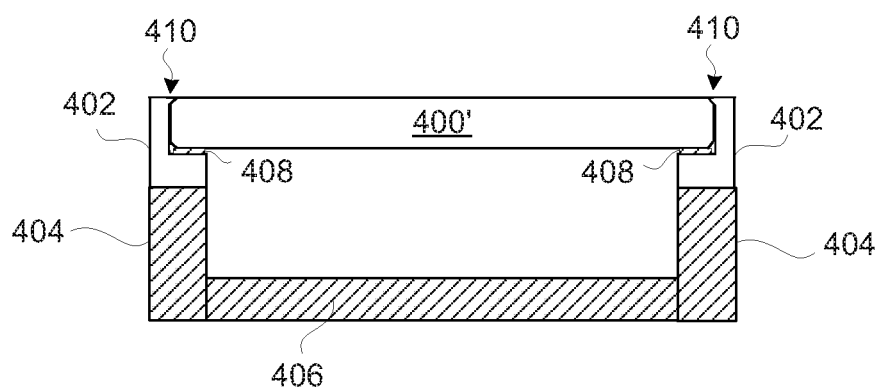
FIG. 4A is a cross-sectional view of an electronic device housing according to one embodiment.
Figure 4B:
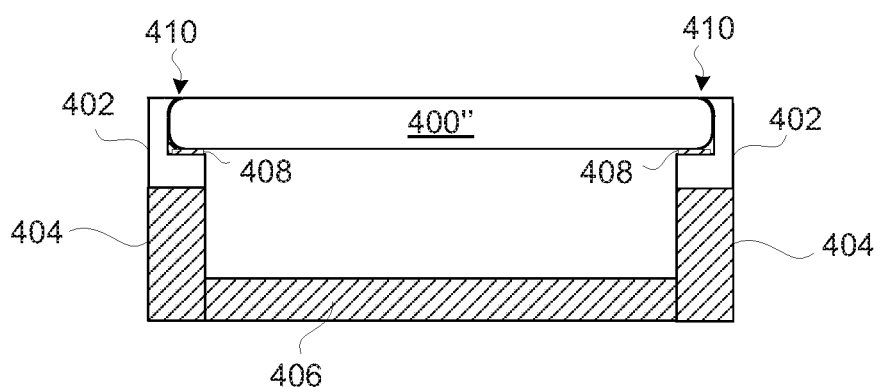
FIG. 4B is a cross-sectional view of an electronic device housing according to one embodiment.

Although the edges of the outer housing members (201, 226, 301, 326) can be square as suggested by FIGS. 2A-3C, it should understood that the edges of the outer housing member need not be square but can be formed with other geometries, such as with chamfered (or flattened) edges or rounded edges. FIGS. 4A and 4B are cross-sectional views of electronic device housings according to other embodiments that are similar to the electronic device housing 200 illustrated in FIG. 2A but which have different edge geometries for the outer device housing.

FIG. 4A is a cross-sectional view of an electronic device housing 400 according to one embodiment. The electronic device housing 400 is the same as the electronic device housing 200 illustrated in FIG. 2A except that the edges 402 of the outer housing member 201' have been chamfered (or flattened). Additionally, the protective side member 202' is molded against the edges of the outer housing member 201', including the chamfered edges 402. Hence, as with other embodiments, by molding the protective side member 202' in place, the outer exposed interface 210' between the sides (e.g., edges 402) of the outer housing member 201' and the peripheral side member 202' is essentially gap-free even though the edges 402 of the protective side member 202' are chamfered.

FIG. 4B is a cross-sectional view of an electronic device housing 420 according to one embodiment. The electronic device housing 420 is the same as the electronic device housing 200 illustrated in FIG. 2A except that the edges 422 of the outer housing member 201" have been rounded. Additionally, the protective side member 202" is molded against the edges of the outer housing member 201", including the rounded edges 422. Hence, as with other embodiments, by molding the protective side member 202" in place, the outer exposed interface 210" between the sides (e.g., edges 422) of the outer housing member 201" and the peripheral side member 202" is essentially gap-free even though the edges 422 of the protective side member 202" are rounded.

Figure 5:
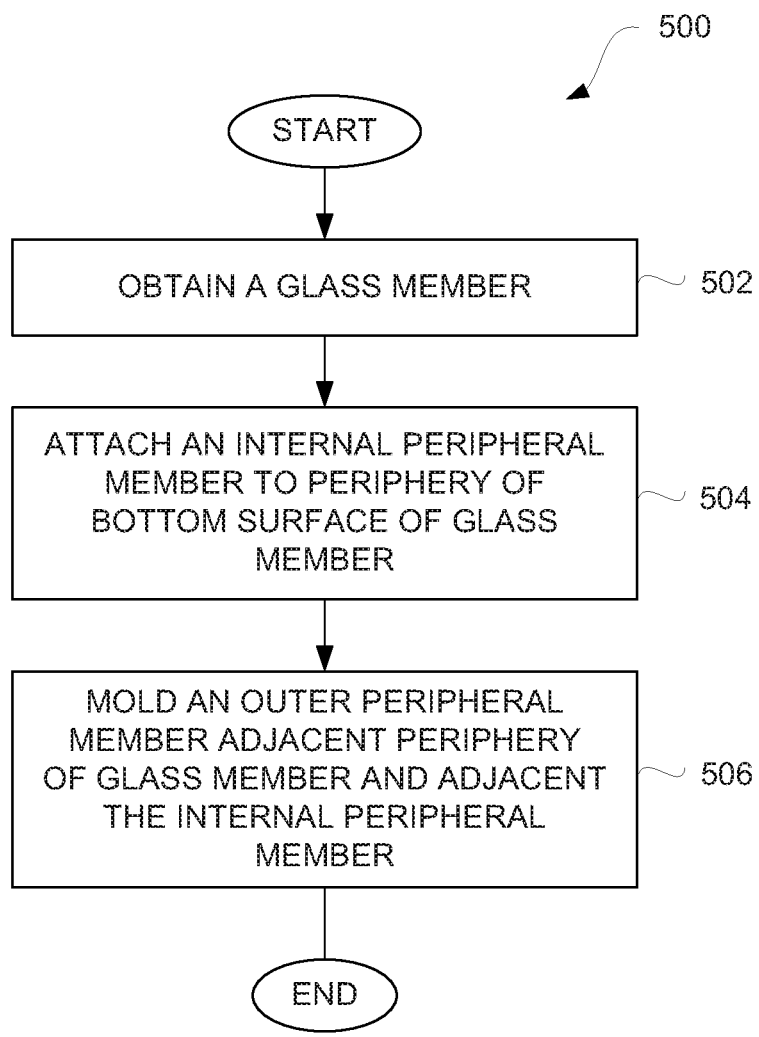
FIG. 5 is a flow diagram of a housing formation process according to one embodiment.

FIG. 5 is a flow diagram of a housing formation process 500 according to one embodiment. The housing formation process 500 can operate to produce a housing for an electronic device, or at least a portion of such a housing.

The housing formation process 500 can initially obtain 502 a glass member to be utilized with the housing for the electric device. The glass member to be utilized is a significant outer surface for the housing. For example, the glass member can correspond to a top surface for the housing. Alternatively, the glass member can correspond to a bottom surface for the housing. The glass member is typically thin, particularly when the housing being formed is for a portable electronic device. In one embodiment, the glass member has a thickness of less than 5 mm, and in another embodiment, the glass member has a thickness of less than 1 mm.

Next, an internal peripheral member can be attached 504 to the periphery of a bottom surface of the glass member. Typically, the internal peripheral member is attached 504 to the bottom surface of the glass member using an adhesive, though other means can be used, such as mechanical features (e.g., undercuts or interlocks).

Thereafter, an outer peripheral member can be formed 506, e.g., molded, adjacent the periphery of the glass member and adjacent the inner peripheral member. The outer peripheral member provides an exposed outer surface for the housing. Specifically, the outer peripheral member provides a thin protective later of material tightly adjacent the periphery of the glass member. The outer peripheral member can chemically bond with the inner peripheral member. Also, the inner peripheral member and/or the outer peripheral member can be secured to a support structure for the housing so that the glass member is able to be mechanically secured to the housing.

Figure 6:
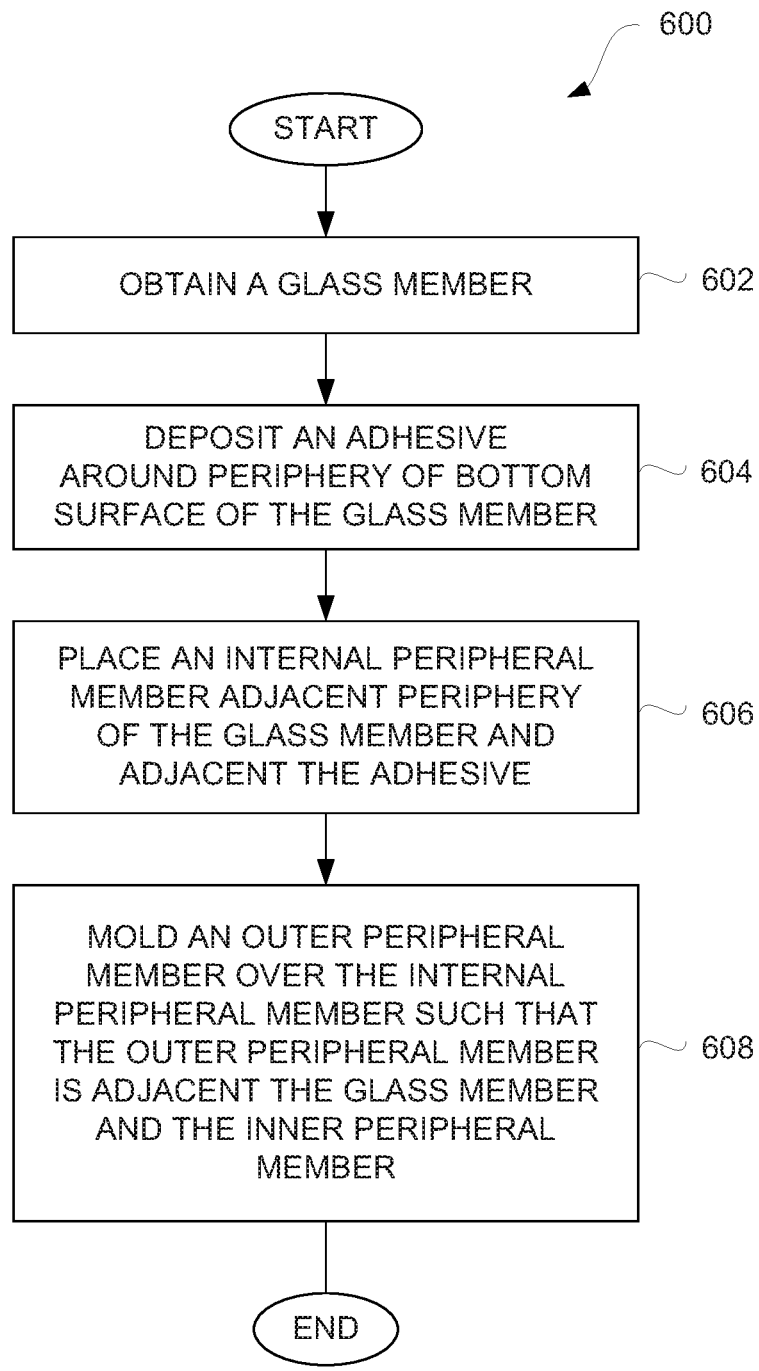
FIG. 6 a flow diagram of a housing formation process according to one embodiment.

FIG. 6 a flow diagram of a housing formation process 600 according to one embodiment. The housing formation process 600 can operate to produce a housing for an electronic device, or at least a portion of such a housing.

The housing formation process 600 can initially obtain 602 a glass member. The glass member is to serve as a significant outer surface for the housing. For example, the glass member can correspond to a top surface for the housing. Alternatively or additionally, the glass member can correspond to a bottom surface for the housing. The glass member is typically thin, particularly when used with portable electronic devices. In one embodiment, the glass member has a thickness of less than 5 mm, or more particularly less than 1 mm.

After the glass member has been obtained 602, an adhesive can be deposited 604 around a periphery of a bottom surface of the glass member. The glass member has a top surface that can represent an outer surface for the housing, and a bottom surface that is an inner surface that is not exposed. In one embodiment, the adhesive being deposited 604 can be a thermally activated adhesive. Also, the manner by which the adhesive is deposited can vary. In one implementation, the adhesive can be deposited 604 by forming a ring-like pattern of adhesive that can be placed around the periphery of the bottom surface of the glass member. In another implementation, the adhesive can be screen printed onto the periphery of the bottom surface of the glass member.

In addition, an internal peripheral member can be placed 606 to the periphery of the glass member and adjacent the adhesive. In one implementation, the internal peripheral member can be secured to the bottom surface of the glass member using an adhesive, though other means can be used, such as mechanical features (e.g., undercuts or interlocks). The internal peripheral member can also be placed 606 by molding the internal peripheral member in place. In one embodiment, if the adhesive is thermally activated, the molding can also serve to activate the thermally activated adhesive so that a strong bond can be provided to the glass member and the internal peripheral member.

Thereafter, an outer peripheral member can be molded 608 over the internal peripheral member such that the outer peripheral member is formed adjacent the periphery of the glass member and adjacent the inner peripheral member. The outer peripheral member provides an exposed outer surface for the housing. Specifically, the outer peripheral member provides a thin protective later of material tightly adjacent the periphery of the glass member. The outer peripheral member can chemically bond with the inner peripheral member. Alternatively or additionally, a thermally activated adhesive could be used between the internal peripheral member and the outer peripheral member (or between the glass member and the outer peripheral member), and the molding of the outer peripheral member in place can also serve to activate the thermally activated adhesive so that a strong bond can be provided the inner peripheral member (and/or the glass member). Also, the inner peripheral member and/or the outer peripheral member can be secured to a support structure for the housing so that the glass member is able to be mechanically secured to the housing. Typically, the peripheral members could be secured to the support structure by chemical bonding and/or mechanical features (e.g., undercuts or interlocks).

Figure 7A:
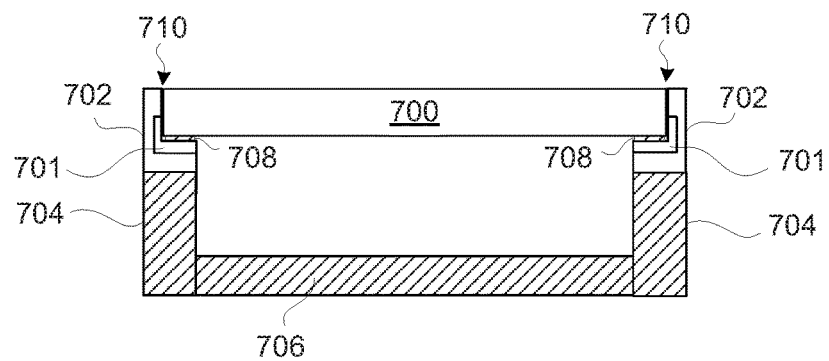
FIG. 7A is a cross-sectional view of an electronic device housing according to another embodiment.

FIG. 7A is a cross-sectional view of an electronic device housing 700 according to another embodiment. The electronic device housing 700 includes an outer housing member 701 supported and protected by an inner protective side member 702 and an outer protective side member 703. The inner protective side member 702 being positioned tightly adjacent sides of the outer housing member 701. The inner protective side member 702 can provide a thin layer of material positioned tightly adjacent sides of the outer housing member 701, thereby buffering impact at the sides of the outer housing member 701. The outer protective side member 703 being positioned tightly adjacent the sides of the inner protective side member 702 as well as the sides of the outer housing member 701. The outer and inner protective side members 702, 703 can individually or in combination provide a thin layer of material positioned tightly adjacent sides of the outer housing member 701, thereby buffering impact at the sides of the outer housing member 701.

One or both of the inner and outer protective side members 702, 703 can also support the outer housing member 701 and serve to secure the outer housing member 701 to other portions of the electronic device housing 700. In one embodiment, the outer protective side member 703 (and possibly also the inner protective side member 702) extends around all sides of the outer housing member 701. In another embodiment, the outer protective side member 703 (and possibly also the inner protective side member 702) extends around those of the sides of the outer housing member 701 that would otherwise be exposed.

As shown in FIG. 7A, the outer housing member 701 can be secured to a support structure 704 of the electronic device housing 700. The support structure 704 can, for example, be an outer periphery member for the electronic device housing 700. In one embodiment, the support structure 704 can couple to another outer housing member 706, which can be formed differently than the outer housing member 701.

The inner protective side member 702 can be secured tightly adjacent the sides of the outer housing member 701 using an adhesive 708. In one embodiment, the adhesive 708 can be applied as a layer of adhesive that is provided around a periphery of an inner side of the outer housing member 701. The adhesive 708 can thus serve to secure the inner protective side member 702 against the sides of the outer housing member 701. The outer protective side member 703 can be molded in place around at least a portion of the inner protective side member 702 and adjacent at least a portion of the sides of the outer housing member 701 so as to be tightly adjacent the sides of the outer housing member 701. By molding the outer protective side member 703 in place, the outer exposed interface 710 between the sides (e.g., edges) of the outer housing member 701 and the outer peripheral side member 703 is essentially gap-free. During the molding, the outer protective side member 703 can be chemically bonded to at least a portion of the inner protective side member 702. Also, if the adhesive 708 is thermally activated, the molding of the outer protective side member 703 can also serve to activate the thermally activated adhesive 708 so that a strong bond can be provided to the outer housing member 701 and the inner peripheral protective side member 702 via the adhesive 708. An internal space 712 is provided internal to the electronic device housing 700 whereby various electrical components can be attached, affixed or placed so as to provide electronic operations for the electronic device.

The various members, parts or assemblies of the electronic device housing 700 can be formed of any of a variety of materials, e.g., glass, polymers or metal. In one embodiment, the outer housing member 701 is glass, the protective side members 702, 703 can be formed from a polymer (e.g., thermoplastic), the support structure 704 can be formed from metal or polymer (e.g., plastic), and the another outer housing member 706 can be formed from glass, polymer (e.g., plastic) or metal. More particularly, in some embodiments, the protective side member 702 can be a structurally strengthened polymer (e.g., thermoplastic). As an example, the protective side member 702 can be polymer, such as polyarylamide, nylon or polycarbonate, which can be structurally strengthened by including glass fibers. For example, some examples of some structurally strengthened polymers include 50% glass filled nylon and 30% glass filled polycarbonate.

Figure 7B:
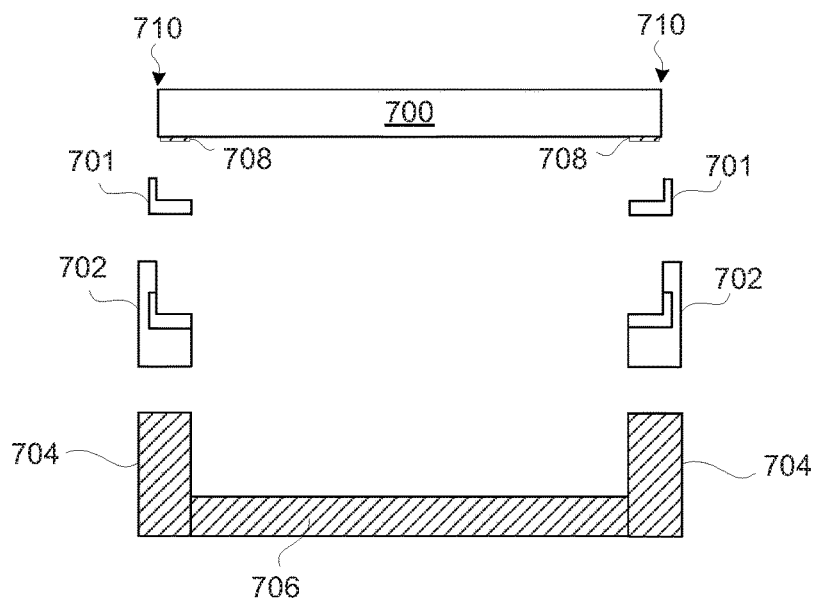
FIG. 7B is a cross-sectional assembly diagram for the electronic device housing shown in FIG. 7A, according to one embodiment.

FIG. 7B is a cross-sectional assembly diagram for the electronic device housing 700 shown in FIG. 7A, according to one embodiment. The outer housing member 701 has a top surface 714 and a bottom surface 716. The bottom surface 716 of the outer housing member 701 has adhesive 708 applied as a layer of adhesive that is provided around a periphery of the bottom surface 716 of the outer housing member 701. The inner protective side member 702 can then be secured adjacent the sides of the outer housing member 701. More particularly, the inner protective side member 702 can be secured to the inner protective side member 702 using the adhesive 708 on the bottom surface 716 of the outer housing member 701. The outer protective side member 703 can be molded adjacent at least a portion of the sides of the outer housing member 701 and adjacent or over one or more sides of the inner protective side member 702. The molding process can also lead to chemical bonding of the outer protective side member 703 and the inner protective side member 702.

Moreover, when the outer protective side member 703 is formed, the outer protective side member 703 can also be adjacent and secured to an upper side portion 718 of the support structure 704. When the outer protective side member 703 is provided at the sides (i.e., edges) of the outer housing member 701, the outer protective side member 703 (alone or in combination with the inner protective side member 702) provides a buffer layer (e.g., bumper) that dampens impact induced at the sides of the outer housing member 701 of the electronic device housing 700.

Figure 7C:
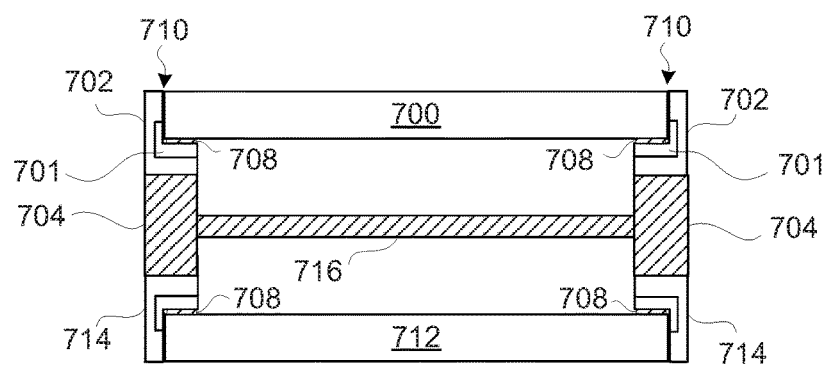
FIG. 7C is a cross-sectional view of an electronic device housing according to one embodiment.

FIG. 7C is a cross-sectional view of an electronic device housing 720 according to one embodiment. The electronic device housing 720 includes a first outer housing member 701 supported and protected by a first inner protective side member 702 and a first outer protective side member. The first inner protective side member 702 is positioned tightly adjacent sides of the first outer housing member 701. The outer protective side member 703 being positioned tightly adjacent the sides of the first inner protective side member 702 as well as the sides of the first outer housing member 701. The first outer and inner protective side members 702, 703 can individually or in combination provide a thin layer of material positioned tightly adjacent sides of the first outer housing member 701, thereby buffering impact at the sides of the first outer housing member 701.

One or both of the first inner and outer protective side members 702, 703 can also support the first outer housing member 701 and serve to secure the first outer housing member 701 to other portions of the electronic device housing 720. In one embodiment, the first outer protective side member 703 (and possibly also the first inner protective side member 702) extends around all sides of the first outer housing member 701. In another embodiment, the first outer protective side member 703 (and possibly also the first inner protective side member 702) extends around those of the sides of the first outer housing member 701 that would otherwise be exposed.

The first inner protective side member 702 can be secured tightly adjacent the sides of the first outer housing member 701 using an adhesive 708. In one embodiment, the adhesive 708 can be applied as a layer of adhesive that is provided around a periphery of an inner side of the first outer housing member 701. The adhesive 708 can thus serve to secure the first inner protective side member 702 against the sides of the first outer housing member 701. The first outer protective side member 703 can be molded in place around at least a portion of the first inner protective side member 702 and adjacent at least a portion of the sides of the first outer housing member 701 so as to be tightly adjacent the sides of the outer housing member 701. By molding the first outer protective side member 703 in place, the outer exposed interface 710 between the sides (e.g., edges) of the first outer housing member 701 and the first outer peripheral side member 703 is essentially gap-free. During the molding, the first outer protective side member 703 can be chemically bonded to at least a portion of the first inner protective side member 702. Also, if the adhesive 708 is thermally activated, the molding of the first outer protective side member 703 can also serve to activate the thermally activated adhesive 708 so that a strong bond can be provided to the first outer housing member 701 and the first inner peripheral protective side member 702 via the adhesive 708.

The electronic device housing 720 can also include an internal structure 722 that is integral with or secured to the support structure 704. In one embodiment, the internal structure 722 can be secured to an inner surface of the support structure 704 such that it is offset from front and back planar boundaries of the support structure 704 (which may be an outer periphery member). As shown in FIG. 7C, the internal structure 722 can be secured at the mid-point of the height of the support structure 704. A first internal space 724 is provided internal to the electronic device housing 720 whereby various electrical components can be attached, affixed or placed so as to provide electronic operations for the electronic device.

In this embodiment, the electronic device housing 720 can also include similar structures on an opposite side of the electronic device housing 720. Namely, the electronic device housing 720 can further include a second outer housing member 726 supported and protected by a second inner protective side member 728 and a second outer protective side member 729. The second inner protective side member 728 can be positioned tightly adjacent sides of the second outer housing member 726. The second outer protective side member 729 can be positioned tightly adjacent the sides of the inner protective side member 702 as well as the sides of the second outer housing member 726. The second outer and inner protective side members 728, 729 can individually or in combination provide a thin layer of material positioned tightly adjacent sides of the second outer housing member 726, thereby buffering impact at the sides of the second outer housing member 726.

One or both of the second inner and outer protective side members 728, 729 can also support the second outer housing member 726 and serve to secure the second outer housing member 726 to other portions of the electronic device housing 720. In one embodiment, the second outer protective side member 729 (and possibly also the inner protective side member 728) extends around all sides of the second outer housing member 726. In another embodiment, the second outer protective side member 729 (and possibly also the second inner protective side member 728) extends around those of the sides of the second outer housing member 726 that would otherwise be exposed.

The second inner protective side member 728 can be secured tightly adjacent the sides of the second outer housing member 726 using an adhesive 730. In one embodiment, the adhesive 730 can be applied as a layer of adhesive that is provided around a periphery of an inner side of the second outer housing member 726. The adhesive 730 can thus serve to secure the second inner protective side member 728 against the sides of the second outer housing member 726. The second outer protective side member 729 can be molded in place around at least a portion of the second inner protective side member 728 and adjacent at least a portion of the sides of the second outer housing member 726 so as to be tightly adjacent the sides of the second outer housing member 726. By molding the second outer protective side member 729 in place, the outer exposed interface 731 between the sides (e.g., edges) of the second outer housing member 726 and the second outer peripheral side member 729 is essentially gap-free. During the molding, the second outer protective side member 729 can be chemically bonded to at least a portion of the second inner protective side member 728. Also, if the adhesive 730 is thermally activated, the molding of the second outer protective side member 729 can also serve to activate the thermally activated adhesive 730 so that a strong bond can be provided to the second outer housing member 726 and the second inner peripheral protective side member 728 via the adhesive 730. An internal space 712 is provided internal to the electronic device housing 700 whereby various electrical components can be attached, affixed or placed so as to provide electronic operations for the electronic device.

Further, a second internal space 732 is provided internal to the electronic device housing 720 (between the internal structure 722 and the second outer housing member 726) whereby various electrical components can be attached, affixed or placed so as to provide electronic operations for the electronic device. The second internal space 732 can be separate from or joined with the first internal space 724.

The various members, parts or assemblies of the electronic device housing 720 can be formed of any of a variety of materials, e.g., glass, polymers or metal. In one embodiment, the outer housing members 701, 726 are glass, the protective side members 702, 703, 728, 729 can be formed from a polymer (e.g., thermoplastic), and the support structures 704, 722 can be formed from metal or polymer (e.g., plastic). More particularly, in some embodiments, the protective side members 702, 703, 728, 729 can be a structurally strengthened polymer (e.g., thermoplastic). As an example, the protective side members 702, 703, 728, 729 can be polymer, such as polyarylamide, nylon or polycarbonate, which can be structurally strengthened by including glass fibers. For example, some examples of some structurally strengthened polymers include 50% glass filled nylon and 30% glass filled polycarbonate.

In one embodiment, the first outer housing member 701 can represent a top outer surface for the portable electronic device, and the second outer surface housing 726 can represent a bottom outer surface housing. In one embodiment, both the first outer housing member 701 and the second outer housing member 726 are glass (e.g., glass covers).

The protective side members discussed above are typically thin layers of material positioned tightly adjacent sides of the outer housing member, thereby buffering impact at the sides of the outer housing members. In one embodiment, the protective side members are to be strong; hence, a structurally strengthened polymer, such as polyarylamide, can be utilized. The polyarylamide can be strengthened by containing glass fibers. One source of strengthened polyarylamide is IXEF polyarylamide (PARA) from Solvay Advanced Polymers, L.L.C which can contain glass fiber reinforcement.

Additionally, since the protective side members are tightly adjacent sides of the outer housing member, the respective materials used for the protective side members and the outer housing member. Specifically, the Coefficient of Thermal Expansion (CTE) of the respective materials, if not controlled, can produce undesired stress on the sides of the outer housing member. For example, with an outer housing member of glass, its CTE is about 10 millimeters/meter/° C. Hence, ideally, for this example the CTE of the material for the protective side members would be about 10 millimeters/meter/° C. Although plastics tend to have CTE's (e.g., roughly 100 millimeters/meter/° C.) that are dramatically higher than that of glass, some manufactured polymers, such as polyarylamide, can have CTE's (e.g., roughly 30 millimeters/meter/° C.) that are substantially closer to that of glass and thereby would, if used, induce less stress on the sides of the outer housing member. For example, in one embodiment, a manufactured polymer for such use could have a CTE less than or equal to about 50 millimeters/ meter/° C., and in another embodiment, a manufactured polymer for such use could have a CTE less than or equal to about 35 millimeters/meter/° C. In one implementation, additive can be added to a polymer so to bring is CTE closer to that of glass. As examples, the additives can be particles or fibers which can be formed from glass or ceramic. Also, as noted above, the thickness of the protective side member can be thin, for example, the thickness can be on the order of about 1 mm or less in one embodiment.

In still other embodiments, the protective side materials can be formed from multiple materials that can be alternated, intertwined or layered. The later of material against the edges of the outer housing member of glass can have a CTE relatively close to that of glass while an outer layer can have a higher CTE can permit a greater range of material, such as polymers (e.g., plastics).

The protective side members are able to be thin yet be cosmetically unintrusive. For example, in some embodiments, the thickness (t1) for the protective side member can be less than 1 mm (e.g., 0.8 mm). Also, in some embodiments, the thickness (t2) of the outer housing member can be less than 5 mm (e.g., 1 mm). However, these thicknesses are exemplary and vary with the size of the electronic device housing and with desired strength. Using a strengthened material for the protective side members as noted above can also be advantageous. Nevertheless, the provisioning of thin protective side members for outer housing members, such as glass covers, facilitates providing portable electronic device housings that are compact and thin yet resistant to side impact damage to the outer housing members.

According to another aspect, a glass member for which a component (e.g., peripheral side member) is being form around can be protected during a molding process. A metal mold is normally used in molding. However, the metal mold can damage (e.g., scratch) a glass member during molding. To mitigate the chance of damage to a glass member, the metal mold (i.e., its inner surfaces) can be coated. The coating can, for example, be a thin layer of polytetrafluoroethylene (PTFE) or polyimide film.

Additional details on side protective members for electronic device housings are contained in U.S. application Ser. No. 12/794,563, filed Jun. 4, 2010, and entitled "OFFSET CONTROL FOR ASSEMBLYING AN ELECTRONIC DEVICE HOUSING," which is hereby incorporated herein by reference.

In general, the steps associated with the methods of the present invention may vary widely. Steps may be added, removed, altered, combined, and reordered without departing from the spirit or the scope of the present invention.

The various aspects, features, embodiments or implementations of the invention described above may be used alone or in various combinations.

While this specification contains many specifics, these should not be construed as limitations on the scope of the disclosure or of what may be claimed, but rather as descriptions of features specific to particular embodiment of the disclosure. Certain features that are described in the context of separate embodiments may also be implemented in combination. Conversely, various features that are described in the context of a single embodiment may also be implemented in multiple embodiments separately or in any suitable subcombination. Moreover, although features may be described above as acting in certain combinations, one or more features from a claimed combination can in some cases be excised from the combination, and the claimed combination may be directed to a subcombination or variation of a subcombination.

While embodiments and applications have been shown and described, it would be apparent to those skilled in the art having the benefit of this disclosure that many more modifications than mentioned above are possible without departing from the inventive concepts herein.

What is claimed is:

1. An electronic device enclosure, comprising:
a glass cover for a top surface for the electronic device enclosure, the glass cover further having sides around a bottom surface;
an adhesive deposited around a periphery of the bottom surface of the glass cover; and
a peripheral structure for providing a support surface for the glass cover and for providing side protective surfaces for the glass cover, the peripheral structure including an inner peripheral member and an outer peripheral member, the inner peripheral member being at least partially secured to the glass cover by the adhesive and the outer peripheral member molded about at least a portion of the sides of the glass cover and adjacent to at least a portion of the inner peripheral member.

2. The electronic device enclosure as recited in claim 1, wherein the outer peripheral structure is molded about the periphery of the bottom surface of the glass cover and molded tightly against the inner peripheral structure; and
an enclosure support structure abutting the peripheral structure and forming, with the peripheral structure, at least part of a substantially continuous sidewall of the electronic device housing.

3. The electronic device enclosure as recited in claim 2, wherein:
the adhesive is thermally activated; and
the adhesive is thermally activated while the peripheral structure is molded about the glass cover.

4. The electronic device enclosure, comprising:
a glass cover for a top surface for the electronic device enclosure;
an adhesive deposited around a periphery of the bottom surface of the glass cover; and
a peripheral structure for providing a support surface for the glass cover and for providing side protective surfaces for the glass cover, the peripheral structure including an inner peripheral member attached to the glass cover via the adhesive and an outer peripheral member molded about at least a portion of sides of the glass cover is at least partially secured to the glass cover by the adhesive; and
an enclosure support structure having a surface coupled to the peripheral structure, the enclosure support structure further comprises another surface, wherein:
the peripheral structure and enclosure support structure cooperate to form a continuous sidewall of the electronic device enclosure.

5. An enclosure for an electronic device, comprising:
an optically-transparent member having sides and a bottom surface;
a peripheral structure comprising:
an inner peripheral member having a first surface coupled to the optically-transparent member; and
an outer peripheral member molded about at least a portion of the sides of the optically-transparent member and molded around the inner peripheral member; and
an enclosure support structure defining at least a portion of the enclosure, the enclosure support structure being coupled to the peripheral member, wherein an exterior portion of the peripheral structure and an exterior portion of the enclosure support structure are substantially coplanar and form a sidewall of the electronic device housing.

6. The enclosure of claim 5, wherein the enclosure support structure is coupled to the outer peripheral member.

7. The enclosure of claim 5, wherein the optically-transparent member is glass.

8. The enclosure of claim 5, wherein the peripheral structure is adjacent the sides and the bottom surface of the optically-transparent member.

9. The enclosure of claim 8, wherein the sides and the bottom surface are substantially perpendicular to one another.

10. The enclosure of claim 5, wherein the optically-transparent member comprises at least one of a chamfered or rounded edge.

11. The enclosure of claim 10, wherein the peripheral structure is adjacent to the at least one of a chamfered or rounded edge.

12. The enclosure of claim 11, wherein no gap exists between the peripheral structure and the at least one of a chamfered or rounded edge.

13. The enclosure of claim 5, further comprising an adhesive between the optically-transparent member and the peripheral structure.

14. An electronic device housing, comprising:
a first cover member formed from one of glass or plastic;
a first peripheral structure supporting the first cover member;
a second cover member;
a second peripheral structure supporting the second cover member;
an enclosure support structure between and abutting the first and second peripheral structures, wherein the first peripheral structure, enclosure support structure, and second peripheral structure cooperate to form a sidewall of the electronic device housing.

15. The electronic device housing of claim 14, wherein:
the first and second peripheral structures are formed from plastic; and
the enclosure support structure is formed from metal.

16. The electronic device housing of claim 14, wherein the first and second cover members are formed from an identical material.

17. The electronic device housing of claim 14, wherein the first cover member overlies a display.

18. The electronic device housing of claim 14, further comprising an internal structure affixed to the enclosure support structure.

19. The electronic device housing of claim 18, wherein the internal structure is integral with the enclosure support structure.

20. The electronic device housing of claim 14, wherein at least one of the first and second cover members comprise a chamfered edge.

21. The electronic device housing of claim 14, wherein at least one of the first and second cover members comprise a rounded edge.

22. The electronic device housing of claim 14, wherein:
the first cover member comprises a beveled edge; and
the first peripheral structure extends at least partly around the beveled edge.

23. The electronic device housing of claim 14, wherein the sidewall is coplanar with a portion of the first cover member.

24. An electronic device, comprising:
a glass cover, the glass cover having sides and a bottom surface;
a display disposed beneath the glass cover;
a touch component operative to sense a touch on the glass cover;
a peripheral structure supporting the glass cover, the peripheral structure including an inner peripheral structure and a molded outer peripheral structure;
an enclosure support structure defining at least a portion of the enclosure and coupled to the outer peripheral structure, wherein:
the inner peripheral structure is situated about a periphery of the bottom surface of the glass cover;
the enclosure support structure is attached to the outer peripheral structure; and
the peripheral structure and enclosure support structure cooperate to form a continuous sidewall of the electronic device housing that is substantially perpendicular to a plane defined by an input surface of the glass cover.

* * * * *